United States Patent [19]

Jones

[11] Patent Number: 5,164,661
[45] Date of Patent: Nov. 17, 1992

[54] THERMAL CONTROL SYSTEM FOR A SEMI-CONDUCTOR BURN-IN

[75] Inventor: Elmer R. Jones, North Reading, Mass.

[73] Assignee: EJ Systems, Inc., Lawrence, Mass.

[21] Appl. No.: 708,353

[22] Filed: May 31, 1991

[51] Int. Cl.$^5$ .......................... G01R 31/02; H05B 1/00
[52] U.S. Cl. ................................. 324/158 F; 219/209
[58] Field of Search ............. 324/158 F, 73.1, 158 R, 324/501, 158 P; 219/209, 210; 307/149

[56] References Cited

U.S. PATENT DOCUMENTS

| 4,145,620 | 3/1979 | Dice | 324/501 |
| 4,503,335 | 3/1985 | Takahashi | 324/158 F |
| 4,607,220 | 8/1986 | Hollman | 324/158 F |
| 4,777,434 | 10/1988 | Miller et al. | 219/209 |
| 4,900,948 | 2/1990 | Hamilton | 324/158 F |
| 4,978,914 | 12/1990 | Akimoto et al. | 219/209 |
| 5,001,423 | 3/1991 | Abrami et al. | 324/158 F |

Primary Examiner—Ernest F. Karlsen
Attorney, Agent, or Firm—Samuels, Gauthier & Stevens

[57] ABSTRACT

An electronic component burn-in thermal control system which accurately and independently controls device case temperature with close-loop conductive heating is provided. A heat exchange device adapted to be placed in heat transfer relationship with the electronic component has a temperature profile different from that of the electronic component.

15 Claims, 7 Drawing Sheets

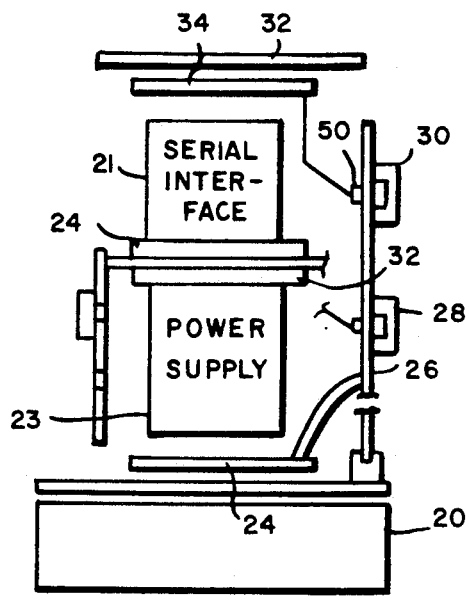
FIG. 2
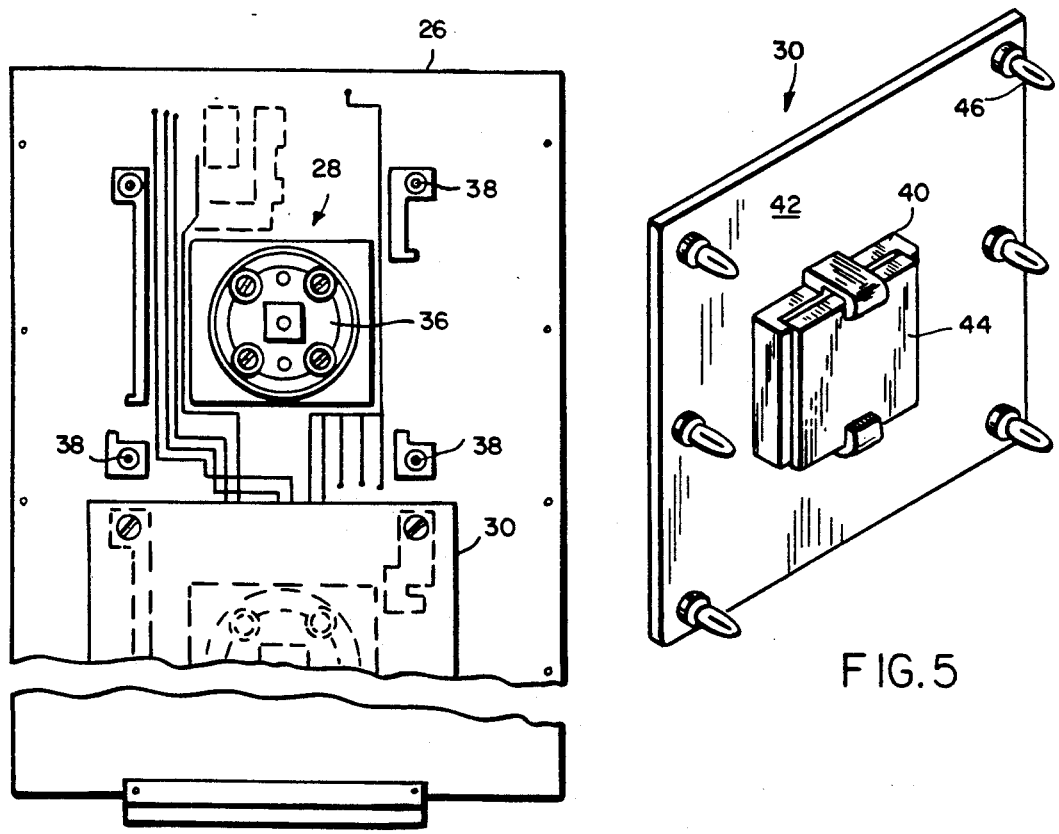
FIG. 4
FIG. 5

THERMAL CONTROL SYSTEM FOR A SEMI-CONDUCTOR BURN-IN

BACKGROUND OF THE INVENTION

The invention relates to a system and method for the burn-in of electronic components such as semi-conductors and the like.

Integrated circuits (ICs), after manufacture and prior to use in a computer system, undergo a variety of tests to ensure they are defect free and will perform as intended. One of the tests conducted is known as burn-in.

Test systems for component testing are well known; for example, semi-conductor life tests in burn-in chambers are common. The process of burning-in typically consists of applying a load to the components being tested at elevated temperatures. This allows identification of weak or faulty components and thus procludes their ultimate use, such as in a computer system.

In addition to burn-in ovens or hot air ovens, other technologies used for this purpose are open loop conduction heating, such as hot plates and thermal probes and liquid bath systems.

The burn-in ovens are by far the most prevalent test device and method used. Second in importance are the liquid burn-in bath methods.

In order to apply a load to the components under test, driver electronics are used which must be isolated from the hot thermal environment of the high temperature oven or liquid bath. This means that the driver electronics must be some distance from the devices under test (DUTs) which compromises frequency limits. Further, DUT trays must be high temperature material which adds to the costs of the testing procedure. The burn-in ovens, or forced air systems, typically have plus or minus 3° C. gradients throughout the chamber as required by MIL-STD-883. However, device heat dissipation makes determining the actual case temperatures (and therefore, junction temperatures) very difficult. Materials used in the chamber must be rated at the highest operating temperature, i.e. sockets, capacitors, resistors, connectors and PC board material. Semi-conductors cannot be used on the PC board above 75° C. because of their unreliability at these temperatures. High frequency applications (approximately 5 mHz) require multi-layer polyimide, PCB's, mother boards, daughter boards and extender boards to be used. High pin count devices require very high I/O's through chamber walls or a compromise must be made. Further, clock cards outside the chamber driving long distances (typically as long as 30 inches) compromise the high frequency operation. In liquid bath systems, the problems are the same as the burn-in ovens. Further, they are more expensive to operate, more inconvenient to operate and clock circuits cannot be put in the bath.

Briefly, some of the common problems with current technology is that the driver electronics are remote from the DUTs. This affects signal quality, the maximum signal frequency that can be used and results in signal skew, cross talk and overshoot. The I/O through the oven walls is not especially suitable for high pin count VLSI components and there is a practical limit to the number of I/O's and the possibility of impairment of signal quality. The trays used in the ovens are expensive, high temperature material. Perhaps the most severe problem is that there are temperature variations throughout the oven due to flow dynamics and one is never really sure of the actual DUT junction temperature. Further, the large monolithic ovens are not amenable to small lot burn-in, independent temperature cycling or independent DUT cool down under bias.

It would be desirable to have the driver electronics as close as possible to the DUT, preferably located on the burn-in tray and to conduct the burn-in in ambient conditions. Most importantly, accurate independent temperature control of each DUT on a burn-in tray would be desirable.

Broadly the invention comprises a thermal control system for burn-in of DUTs which accurately and independently controls the device case temperature of each DUT with close-loop conductive heating and further includes over temperature protection, under temperature protection and junction temperature correction. Using a close-loop method of conductive heating for each DUT, the invention can heat the device case temperature to say 200° C. at an accuracy of less than plus or minus 2° C. The invention uses closed-loop sensors that read temperatures directly from the device case assuring that the DUT reaches the desired temperature at each DUT position. A conductive module which includes a heater and sensors engages the DUT. Therefore, a separate heat source services each position. Thermal control for each position is via a dedicated microprocessor with the processor set up in turn by a computer. With individual control, each position can be heated to different temperatures over different time intervals. The sensor which reads the temperature of the DUT is isolated from the heater which contacts the DUT. Therefore, the temperature reading is not influenced by the temeprature of the heater. Further, the sensor and heater are individually suspended whereby uniform engagement with the DUT is ensured.

In a preferred embodiment, the system is embodied in a tower-like structure where each position is located on the outer surface of the structure. The conductive module is secured to the outer surface of the tower, its heater and sensors extending outwardly. The DUT socket releasably engages the conductive module at the DUT position. Mother boards containing the DUT clock card with driver electronics are arrayed vertically in the tower in a wall-like configuration and communicate with lower horizontally-fixed backplanes secured in the tower. These backplanes distribute the DC voltages to the mother boards which in turn distribute the load to the DUT's. Thermal control boards communicate with upper backplanes, which backplanes are secured horizontally in the tower. These boards control the DUT device case temperature. The control board communicates with a microprocessor via the upper backplane.

The conductive modules are secured to the tower and pass through the mother board. The conductive modules are computer controlled by the thermal control boards. The DUT sockets frictionally engage the mother board and electrically communicate therewith. The DUT contacts a sensor on the conductive module. Because the driver electronics can be placed close to the DUT, the system provides signal quality greater than 40 mHz.

BRIEF DESCRIPTION OF THE DRAWINGS

FIG. 2 is an exploded schematic of the apparatus of FIG. 1;

FIG. 4 is a schematic of a mother board and a conductive module;

FIG. 5 is a perspective view of a DUT socket;

DESCRIPTION OF THE PREFERRED EMBODIMENT(S)

The structure of the tower is described more fully in my copending application entitled Burn-In Tower filed on even date herewith, which application is hereby incorporated by reference in its entirety into this disclosure.

Figure 1:
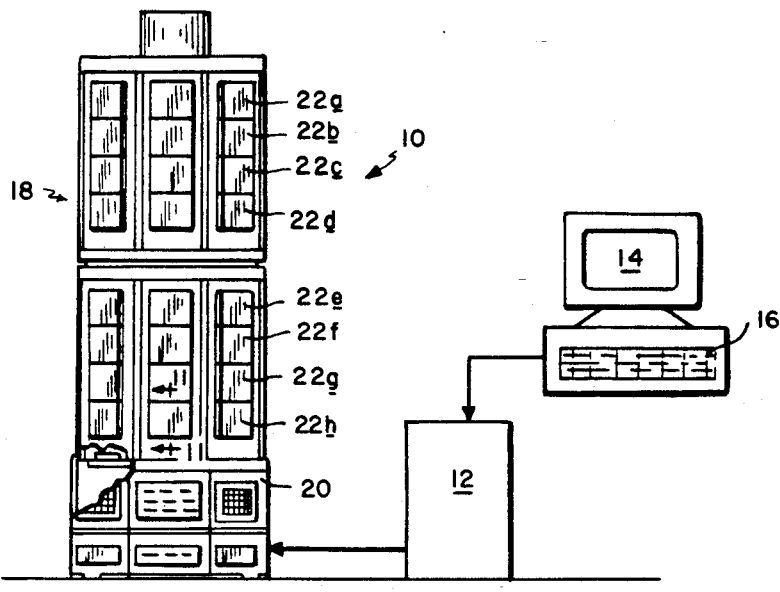
FIG. 1 is a schematic of an apparatus embodying the system of the invention.

Referring to FIG. 1, an apparatus embodying a system of the invention is shown generally at 10 and comprises a CPU 12, such as a IBM PS-2, a display 14, a keyboard 16 and an octogonal tower 18, suitable for burning in sixty-four DUTs, rotatably mounted on a base 20. Each of the eight sides of the tower comprises eight vertically arrayed burn-in positions 22. On one side, these positions are indicated as 22a, 22b, 22c, 22d, 22e, 22f, 22g and 22h. The tower includes identical upper and lower sections, each having thirty-two DUT positions. The sections being identical, only one will be described in detail.

Referring to FIG. 2, the basic components of the system are shown schematically and comprise a lower backplane array 24 which communicates via ribbon connectors (not shown) with eight mother boards 26, each having four DUT positions 28. Each mother board contains the driver electronics and clock cards to apply the load to the DUT at each DUT position. Joined to the mother board 26 at any one or all of the DUT positions is a DUT socket assembly 30. Conductive modules 50 (described hereinafter with reference to FIGS. 6 and 7) are secured to the tower walls 18 at each DUT position and they are spaced apart from the underside of the mother boards 26 at each DUT position. A portion of the module 50 extends through an opening in the mother board. An upper backplane assembly 32 is horizontally secured within the tower. Thermal control boards 34 each communicate with four conductive modules 50 at the DUT positions. A power supply 23 and a serial interface 21 are provided for the tower 22 to serve all sixty-four DUT positions. The power supply 23 includes a power pack (not shown) comprising three 100 watt switching regulation power supplies at −12 V, +5 V and +12 V which provides the power for the driver electronics. The serial interface 21 (RS 232) allows for the communication between the computer and the microprocessor. Other than the fact the driver electronics are carried on the mother board and the load is applied through a DUT socket assembly, the electronics does not differ from the prior art electronics, this being determined by the device manufacturer. The tower may also include status lights, power on/off lights, DUT position malfunction lights, etc. However, these need not be described in detail as they do not form a critical part of the invention.

Figure 3B:
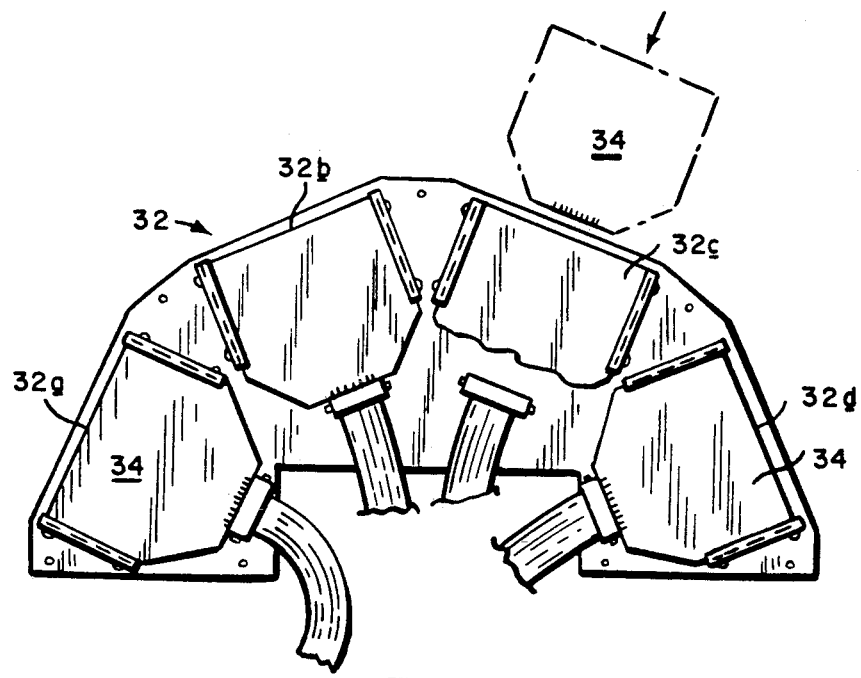
FIGS. 3a and 3b are schematics of backplanes and control boards used in the apparatus.
Figure 3A:
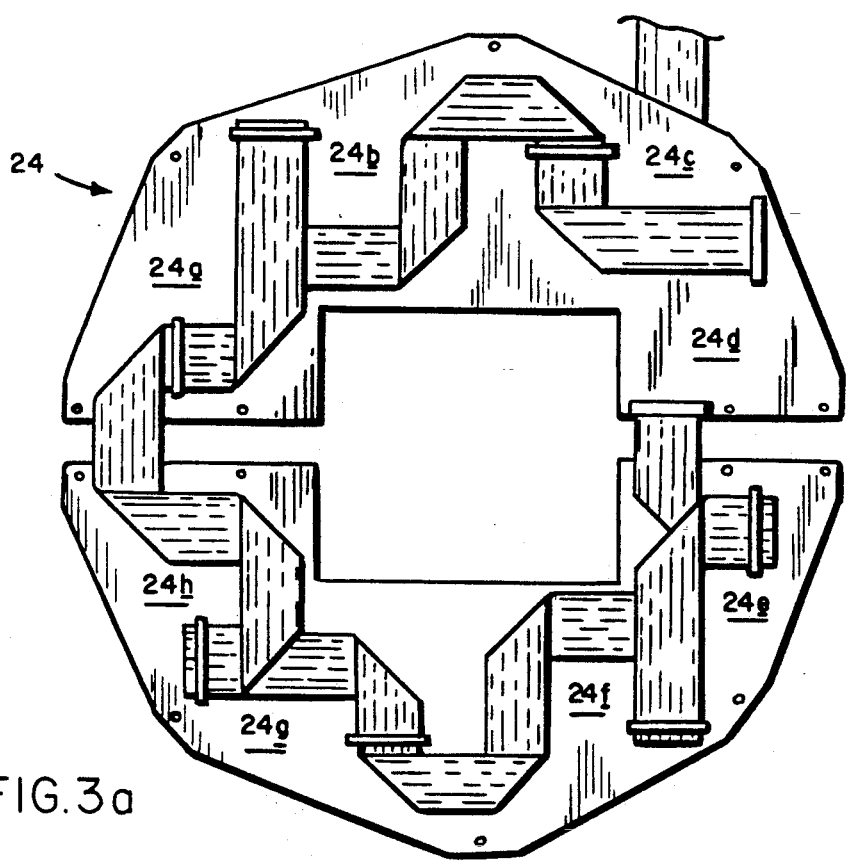

Referring to FIG. 3a, the backplane assembly 24 comprises eight back planes 24a–24h, each supporting one mother board and four DUT positions. The backplane assembly 24 is octagonal in shape to conform to the tower-shape and is structurally secured to the tower in any suitable manner. The upper backplane assembly 32 is shown in FIG. 3b. There are eight backplanes horizontally secured in any suitable manner in the upper portion of the tower section, each of the eight backplanes supports four thermal control boards. Only four backplanes are shown in FIG. 3b. Secured to each backplane is a thermal control board 34. Each thermal control board 34 communicates with four conductive modules 50.

Referring to FIG. 4, a section of a mother board 26 is shown with the upper position open and the lower position having a DUT socket assembly 30 engaged thereto. The mother board includes four openings 36, through which a portion of the associated conductive modules 50 passes. The board comprises the clock card and driver electronics, which is shown schematically, which are applied to the DUT, and defines the four DUT positions 28.

Referring to FIG. 5, the DUT socket assembly 30 comprises a socket 40, such as a 224 pin ceramic quad, which is secured to a daughter board 42. A device to be tested (DUT), such as a semi-conductor chip 44, is inserted into the socket 40 and during burn-in, the electrical load is applied to the DUT in a conventional manner. The daughter board 42 has four depending locator pins 46. When the assembly is secured to the mother board the pins are secured in the sockets 38 (see FIG. 4). The circuits on the underside of the daughter board are simply those necessary to carry the load from the mother board 26 to the DUT via the socket/pin connections.

Figure 6:
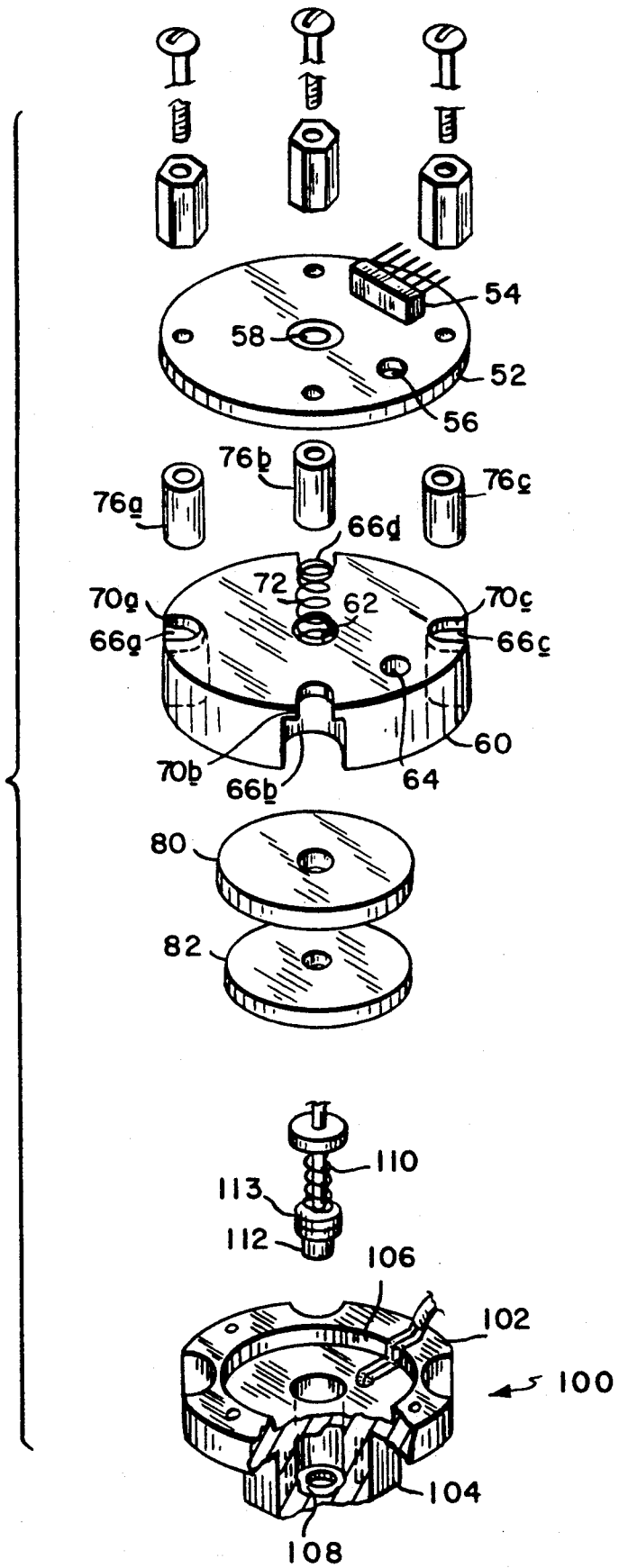
FIG. 6 is an exploded view of the conductive module.
Figure 7:
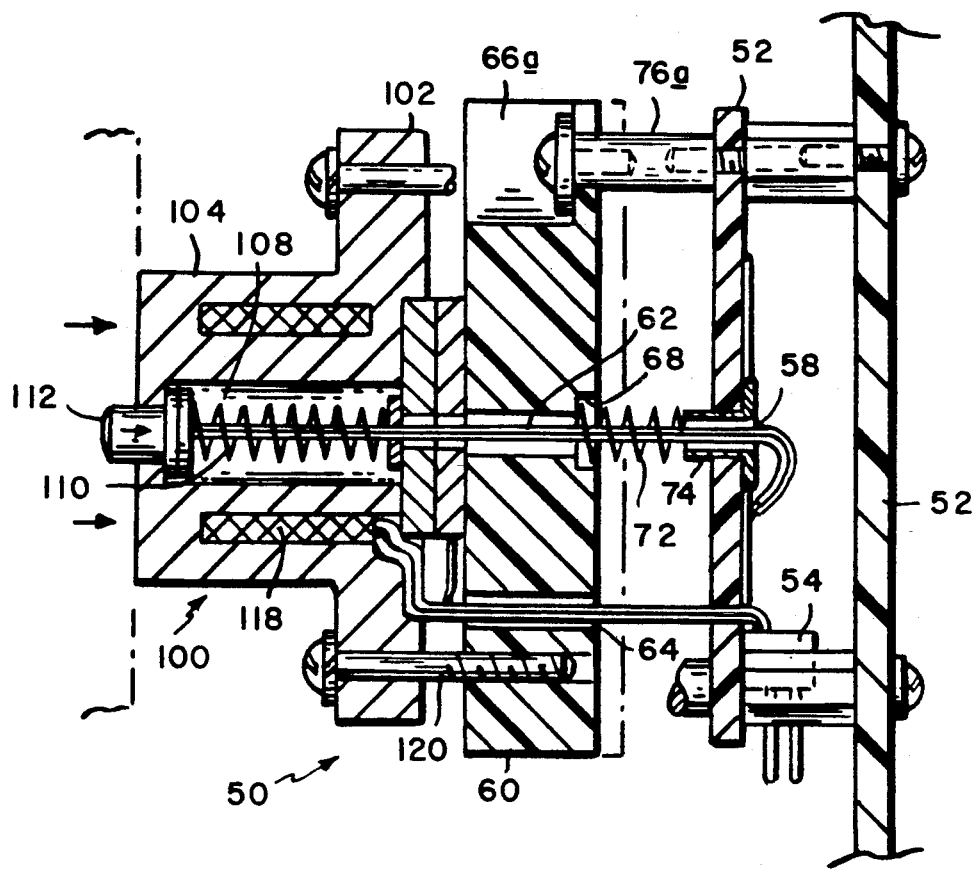
FIG. 7 is a sectional view of the conductive module.

Referring to FIGS. 6 and 7, the conductive module 50 is secured to support strips 52 which are rigidly secured within the tower in paired relationship. That is, a pair of support strips are disposed vertically in the tower for each four position DUT. They are spaced apart from and behind the mother boards. The module comprises base plate 52 having a termination strip 54 thereon to which a ribbon cable is connected. A circular plate 60 is spaced apart from and secured to the plate 52. The plate 60 has a central opening 62 through which two pairs of wires pass and an opening 64 through which a pair of wires pass. The plate 60 has four semicircular recessed sides 66a–66d. The upper surface of the plate 60 includes a circular recess 68. The recesses 66a–66d include arc-like flanges 70a–70d. The plate 60 is biased away from the plate 52 by a spring 72. The spring is received in the recess 68 of the plate 60 and fits over a depending sleeve 74 on the plate 52.

Posts 76a–76d are threaded at one end to the plate 52 and include flanged heads 78a–78d at the other end. The posts 76a–76d pass through the recesses 66a–66d and the flanged heads 78a–78d on the underside of the plate 60 limit the bias of the plate 60 away from the plate 52 by engaging the underside of the flanges 70a–70d. The diameters of the recesses 66a–66d and the flanges 70a–70d are greater than the diameters of the posts 76a–76d. Thus, the plate 60 (and components attached thereto) is free to move with a gimbal-like motion. More specifically, the plate may move vertically, the distance shown by the arrows in FIG. 7. The plate 52 also has limited oscillatory motion within the limits defined by the relative differences of the diameters of the posts 76a-76d and recesses 66a-66d/flanges 70a-70d.

Underlying the plate 60 are a heating element 80, such as a thin film resistance heater, and a heat transfer plate 82, such as an aluminum conductor, each having central apertures through which the two pair of wires pass.

A heating assembly 100 is secured to the plate 60 and comprises an upper plateau-like portion 102 and a depending rectangular heating block 104. The portion 102 includes a disc-shaped recess 106 in which the plate 82 is secured. Secured in the heating block 104 is a sensor 118, such as a thermistor. The block 104 has a central open passageway 108 and secured therein is a spring 110. The spring is secured to the plate 82. A temperature sensor 112, such as a thermistor, is secured to the other end of the spring 110. A flange 113 limits the outward bias of the sensor. The sensor normally extends through the bottom plane of the portion 104. The dimensioning of the sensor 112 within the passageway 108 is such that, regardless of the relative provisions of the portion 102 and the sensor 112 when engaged to a DUT, they do not come in contact with each other. Slight pivotal movement of the sensor 112 is allowed, but this movement is limited by the dimension of the flange 113 in the passageway 108 to ensure that the sensor cannot contact the heating block 104. The sensor 112 is therefore adapted for limited relative pivotal motion and unlimited upward vertical motion within the block 104 and this ensures that if a DUT is not properly seated, the sensor may tilt or cant or be otherwise orientated to ensure a flush contact with the DUT.

Similarly, the block 104, which itself is secured to the plate 60 by threaded fasteners 120 which pass through the flange of the upper portion 102 and into the plate 60, is also adapted for relative movement with reference to the DUT to ensure flush contact between the heating block 104 and the DUT. When assembled, the plate 60, the heating element 80, the conductive plate 82, and the heating assembly 100 are secured together as an integral unit. Both the sensor 112 and the heating block 104 are each independently adapted for relative non-contacting movement one to the other to ensure proper contact with the DUT.

Figure 8:
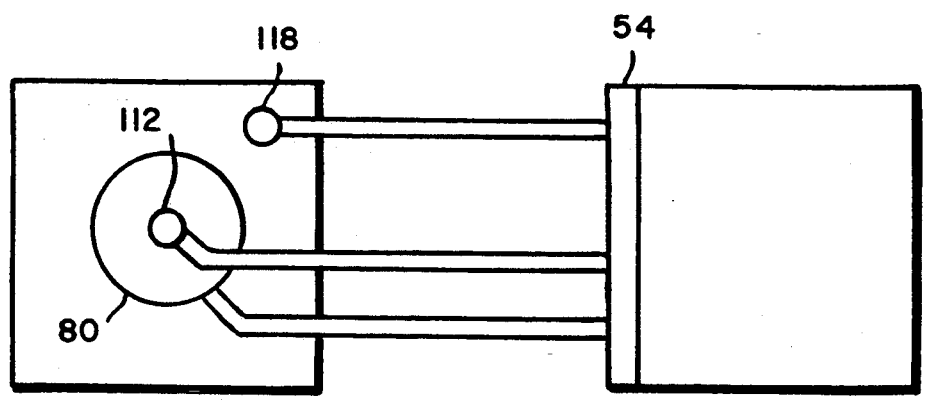
FIG. 8 is a schematic of the wiring for the conductive module.

The flow of the heat is from the heating block 104 to the DUT and from the DUT to the sensor 112. The sensor only senses the temperature of the DUT. This sensing is independent of the temperature of the heating block. The conductive module 50 includes three pairs of wires, one pair each from the two sensors 112 and 118, and one pair for the heating element 80. These wires are connected to the termination strip 54. A schematic of the wiring is shown in FIG. 8.

Figure 9:
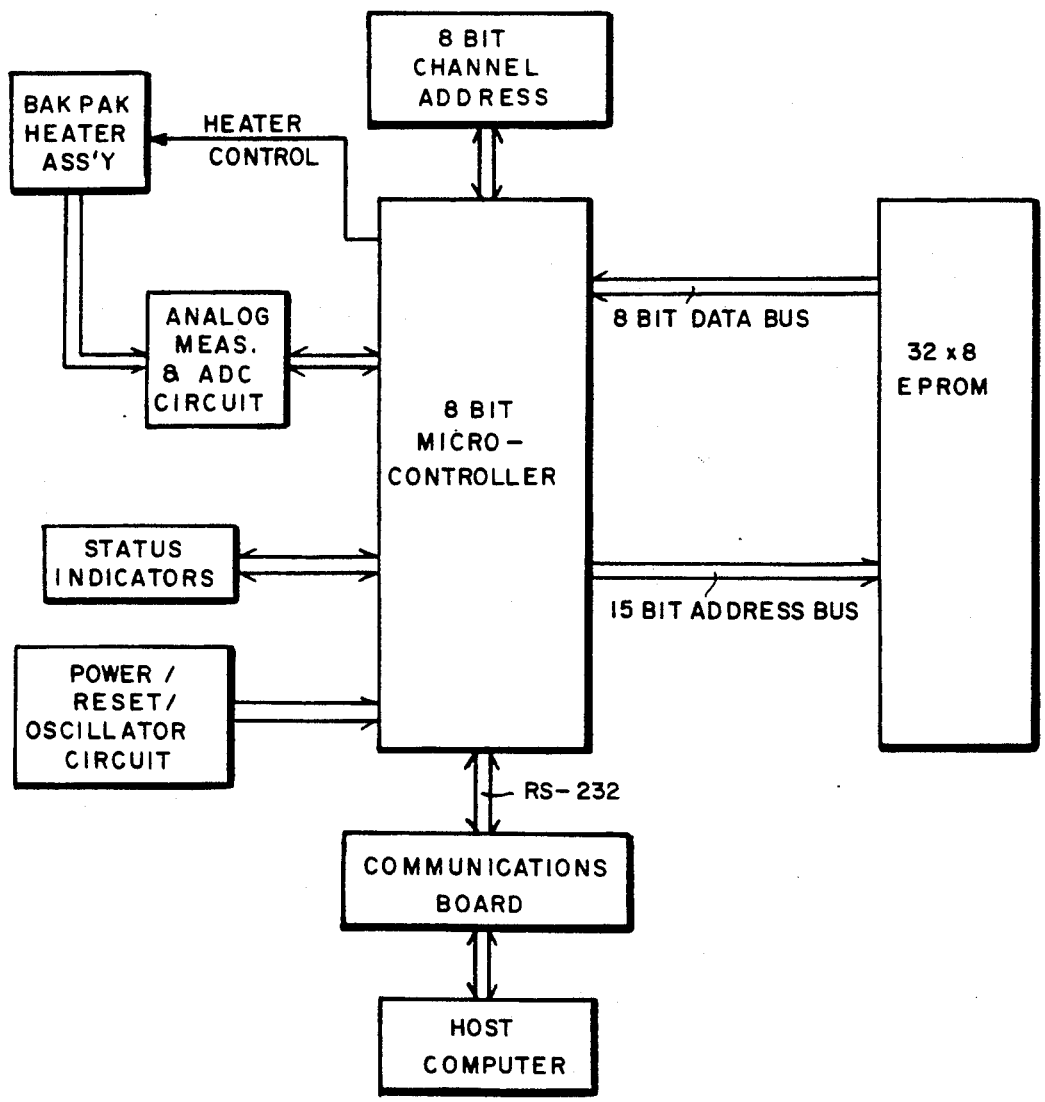
FIG. 9 is a function block diagram of the control board.
Figure 10:
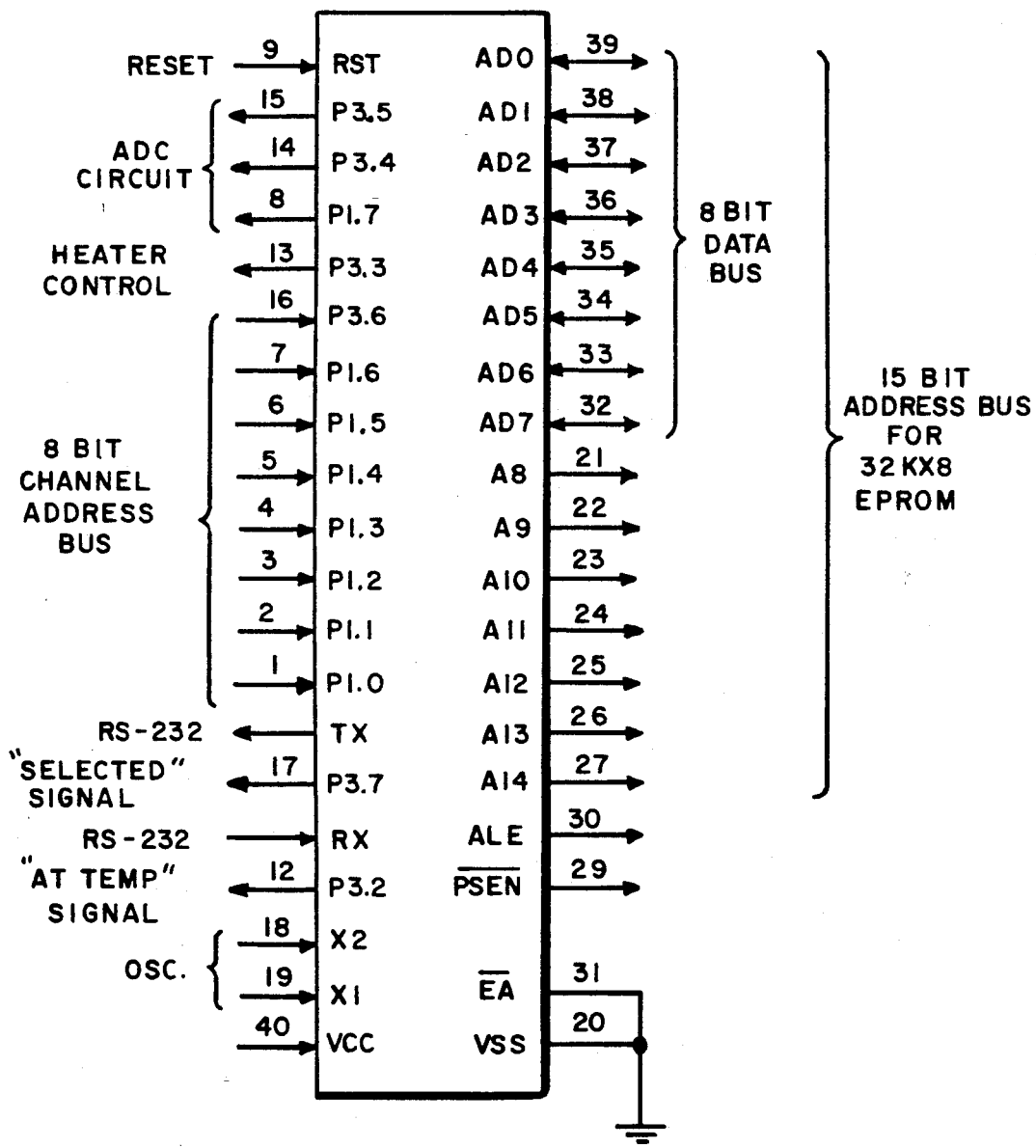
FIG. 10 is a pin out of the microcontroller of the control board.

Referring to FIG. 9, a functional block diagram of the thermal controller for one position is shown. Each thermal control board comprises four microprocessors, each with an associated E-prom. The structure and function of each of the microprocessors and E-prom being identical, only one is shown in detail. FIG. 10 shows the pin out for the microprocessor.

The thermal control board 34 comprises the microprocessors, the E-proms, and associated analog components to control the temperature level and cycles applied to each of the DUT's. The board comprises a ribbon connector to provide communication between the board and a conductive module, a connector to provide communication with the CPU, a connector to provide the power for the heaters in the conductive modules and a connector for the power for the board, and a connector to provide information to display panels if desired.

OPERATION OF THE INVENTION

The operation of the invention will be described with reference to the burn-in of a specific device, i.e. an IC, at a single DUT position. As will be apparent from the discussion of the operation of the invention, all sixty-four positions, or some of the sixty-four positions, may be used to burn-in the same type DUTs or different DUTs. That is, each individual DUT position can be programmed to test different components under different conditions.

When a specific type of device is to be tested, a temperature profile of the device is first developed. Establishing a temperature profile involves placing a thermistor or thermocouple at the device junction. The device is inserted into a socket 40. The conductive module engages the socket assembly 30. Heat is applied to the device and several readings at different temperatures are made to determine the actual difference in temperature at the center (junction temperature) and the temperature on the surface of the device (case temperature). It has been found that this profile results in a straight line function. That is, over the temperature range tested, the difference between the case temperature and the junction temperature is the same. Even if it were not a varying difference could be programmed into the microprocessor. For example, depending upon the specific device, the materials of construction and size, the case temperature read by the sensor 112 could be 65° C. while the junction temperature could be 60° C. The junction temperature of the device is the temperature that is desired to be known and controlled. Having determined this temperature difference from the temperature profile for these types of devices, the microprocessor is then programmed such that when the temperature at which the device is to be tested is entered, say 65° C., this temperature will be displayed on the screen. However, in actuality the true temperature reading on the surface of the device (case temperature) will be 70° C. because the actual junction temperature, which is really the temperature being measured, will be the desired 65°. Thus, before any series of devices are tested, a temperature profile for the series is established and the microprocessor programmed to account for this temperature difference.

Figure 11:
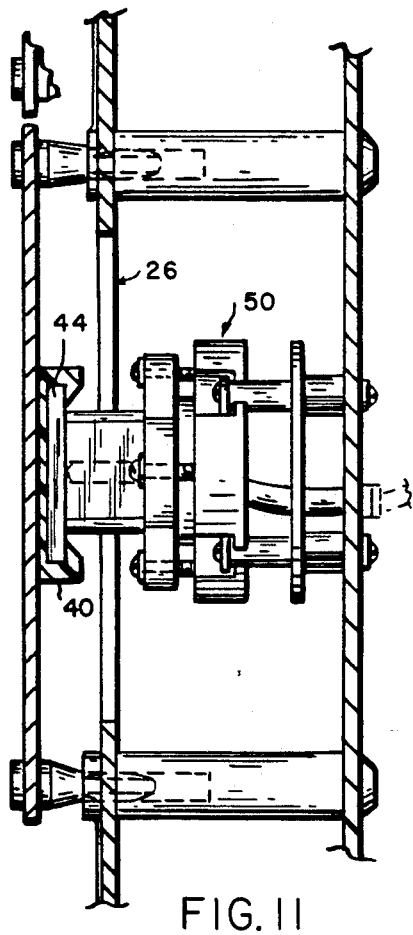
FIG. 11 is a side view of a mother board, conductive module and DUT socket in an engaged position.
Figure 12:
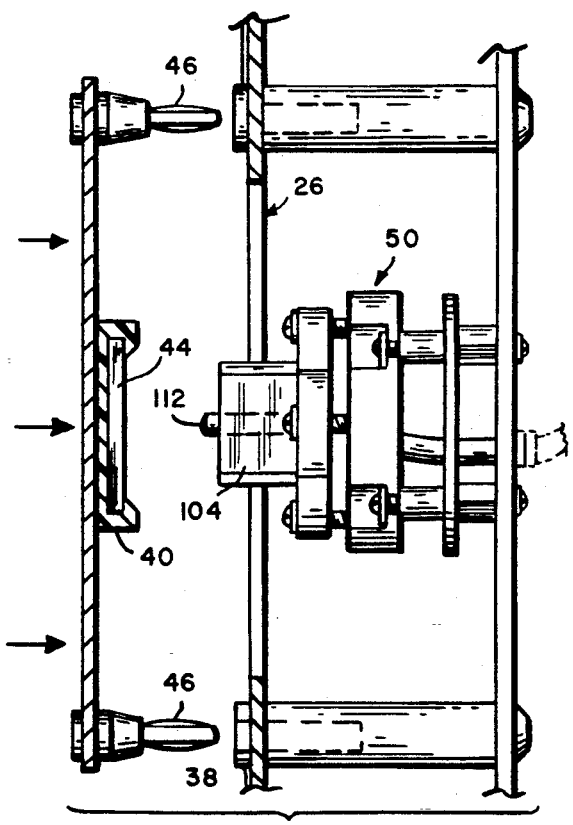
FIG. 12 is the same as FIG. 11 with the conductive module and DUT socket in a non-engaged position.

An IC 44 to be tested is inserted into the socket 40. The socket assembly 30 is brought into engagement with the conductive module 50. Referring to FIGS. 11 and 12, the locator pins 46 are inserted in the sockets 38 in the mother board 26. The sensor 112 contacts the center of the IC such that the face of the sensor 112 remains flush with the surface of the IC. The flush contact is ensured by the ability of the sensor 112 to move within the heating block 104. The face of the heating block 104 is also placed into contacting engagement with the case of the IC and is flush with the surface of the case. This is also possible because the heating block 104 is adapted for gimbal movement as previously described.

It is well known to those skilled in the art that the computer comprises suitable interface, storage and computation units for performing arithmetical and logical functions on data, processed in digital form. Any standard computer language consistent with the capability of the computer can be used with the instructions. The routines may be written in any desired notations, formats or sequence depending upon the particular computer being utilized, computer language, etc. Thus, the computer may be loaded with various programs to accomplish the following steps in the operation of the invention.

The following illustrative parameters are entered into the CPU through the keyboard in response to screen prompts.
1. Select position to be enabled
2. Enter temperature at which device is to be tested
3. Enter maximum and minimum temperatures ($\pm\#$C.)
4. Enter duration of tests
5. Enter temperature steps
6. Enter time steps
7. Enter DUT power dissipation
8. Enter DUT $\phi$JC (Optional)

The following is a typical heater set up screen:

| HEATER SET UP SCREEN - TEMPERATURE CYCLING ENABLED SET UP PARAMETERS FOR HEATER | | | 1 2 3 4 5 6 7 8 9 10 11 12 13 14 15 16 | | | |
|---|---|---|---|---|---|---|
| HEATER STATE: | LOGGED ON | | CHIP TEMP (°C.) | TIME HHHH:MM) | CHIP TEMP (°C.) | TIME HHHH:MM) |
| HEATER CONTROL: | ENABLED | STEP 1: | 35 | 0:10 | 16: 125 | 0:30 |
|  |  | STEP 2: | 45 | 0:20 | 17: 115 | 0:30 |
| OVR TEMP DELTA: | 10 | STEP 3: | 55 | 0:30 | 18: 105 | 0:30 |
| IN RANGE ± °C.: | 3 | STEP 4: | 65 | 0:40 | 19: 95 | 0:30 |
| TEMP CYCLING: | ENABLED | STEP 5: | 75 | 0:50 | 20: 85 | 0:30 |
| NUMBER STEPS: | 25 | STEP 6: | 85 | 1:00 | 21: 75 | 0:30 |
| NUMBER CYCLES: | 1 | STEP 7: | 95 | 1:10 | 22: 65 | 0:30 |
|  |  | STEP 8: | 105 | 1:20 | 23: 55 | 0:30 |
|  |  | STEP 9: | 115 | 1:30 | 24: 45 | 0:30 |
| CASE STYLE: | CERAMIC | STEP 10: | 125 | 1:40 | 25: 35 | 0:30 |
| COMPENSATE $\phi$JC: | DISABLED | STEP 11: | 135 | 1:50 |  |  |
| DUT POWER (mW): | 500 | STEP 12: | 145 | 2:00 |  |  |
| DEVICE $\phi$JC: |  | STEP 13: | 155 | 2:10 |  |  |
|  |  | STEP 14: | 145 | 1:00 |  |  |
|  |  | STEP 15: | 135 | 1:00 |  |  |

In the exemplary heater set-up screen shown above there is provided an optional function $\phi$JC. With this $\phi$JC function disabled, the user will have displayed and/or printed out temperatures, i.e. 65° C., corresponding to 'case temperatures' as the device case terminology with which the industry is familiar. However, as discussed above the temperature displayed and/or printed out is the actual junction temperature, i.e. 65° C.

The parameter DEVICE $\phi$JC refers to the manufacturing's rating of the device, which is a function of the thermal resistance from the junction of the DUT to the case surface.

If the user wishes to measure junction temperature directly, $\phi$JC is enabled and the manufacturers rated value, i.e. 15, is input. This value is informational and is displayed and/or printed out. Also, the user will have displayed and/or printed out the set temperature as a junction temperature, i.e. 65° C.

After all parameters have been entered, a designated function key is pressed to start burn-in. This also activates the clock card and associated heaters to apply load to the DUT. The temperature sensed during a cycle is based on the readings from the sensor 112. If this reading violates the preset temperature range, the temperature of the heating block 104 as read by the sensor 118 is raised or lowered and the power to the heating element 80 is increased or decreased. The temperature in the heating block 104 is controlled in response to temperature readings taken by the sensor 118. The case temperature of the DUT is read by the sensor 112. When the case temperature of the DUT violates a preset value, the temperature of the heating block is increased or decreased by the increasing or decreasing the power to the heating element 80.

The applied heat flows by conduction from the heating block 104 through the DUT, and thereafter back to the sensor 112. As previously described, the gimbal construction of the conductive module 50 and the sensor 112 ensures flush contact between the heating block to the DUT, and the DUT to the sensor 112. As a practical matter, this construction eliminates air between the surfaces which would normally create an additional thermal resistance. The temperature profile of the case of the DUT will normally be different from the known temperature profile of the heating block 104. Also, the DUT may experience heat losses to ambient. All of the above contribute to the losses between the temperature applied to the DUT case and the temperature which the junction achieves.

In effect, the process allows the user of the system to set a desired temperature range for the heat to be applied to the DUT junction, which in turn involves setting the heating block 104 to an appropriate level so that the desired junction temperature is achieved. The actual temperature of the DUT case is sensed by sensor 112 and adjustments are made by increasing or decreasing the temperature of the heating block. In light of the heating block temperature being monitored, and under normal conditions knowing the temperature profiles of the heating block and the DUT with the expected losses to ambient, the sensed temperature of the DUT case is converted to a reading corresponding to the desired DUT junction temperature. This temperature value in turn is displayed to the user of the system.

Monitoring information corresponding to the actual test conditions in the form of print outs, screen displays, graphics and/or text is desirable and well within the skill of the art. Also, error signals for manual or automatic disabling of a position(s) is well within the skill of the art.

Also, the application of the load applied to the DUT by the driver electronics has not been described in detail because it does not differ from prior art applications.

The foregoing description has been limited to a specific embodiment of the invention. It will be apparent, however, that variations and modification can be made to the invention, with the attainment of some or all of the advantages of the invention. Therefore, it is the object of the appended claims to cover all such variations and modifications as come within the true spirit and scope of the invention.

Having described my invention, what I now claim is:

1. A system for burn-in of a device(s) under test (DUT) having a first temperature profile, said system comprising:
   a socket assembly including at least one socket for a DUT;
   a conductive module adpated to engage the socket assembly and in communication with the DUT, the module having:
      a heat-exchange device adapted to be placed in heat transfer relationship with the DUT, which heat exchange device has a second temperature profile;
      means to heat the heat exchange device;
      a DUT temperature sensor received within the heat exchange device and thermally isolated from the heat exchange device to measure the temperature of the DUT; and
      a temperature sensor received within the heat exchange device to measure the temperature of the heat exchange device;
   means to place the heat exchange device in heat·transfer relationship with the DUT; and
   means to control the temperature of the DUT based on the sensed temperature of the heat exchange device and the temperature profiles of the DUT and heat exchange device.

2. The system of claim 1 which includes:
   means to establish upper and lower temperature limits for the temperature of the DUT.

3. The system of claim 1 which includes:
   means to establish a sequence of times for actuation of the heat exchange device at distinct temperature levels; and
   means to control the duration of actuation of the heater at each said temperature level.

4. The system of claim 1 which includes:
   a plurality of sockets, each socket having associated drive electronics;
   a conductive module for each DUT received in a socket; and
   means to control independently the actuation of each heat exchange device in the conductive module and to control the duration of actuation of each heat exchange device in each conductive module.

5. The system of claim 1 which comprises:
   a plurality of burn-in trays, each of said trays having at least one socket therein, a conductive module for each of said sockets; and
   means to control the actuation of each heater in each temperature controller independently and to control the duration of actuation of each heater.

6. The system of claim 1 which includes:
   means to moveably mount the heat exchange device within the conductive module to ensure flush contact of a heat exchange surface of the heat exchange device with the DUT.

7. The system of claims 1 or 6 which includes:
   means to moveably mount the DUT temperature sensor within the heat exchange device.

8. The system of claim 7 wherein the DUT temperature sensor is mounted in a gimbal-like configuration.

9. The system of claim 8 wherein the DUT temperature sensor is moveably mounted within the heat exchange device and is adapted for movement independent of the movement of the heater.

10. The system of claim 1 which comprises a plurality of burn-in trays, each tray having a plurality of socket assemblies, each socket assembly having an associated conductive module, the burn-in trays having formed thereon drive electronics to apply a load to the DUT.

11. The system of claim 10 wherein the drive electronics comprises a mother board formed on the burn-in tray; and
    a daughter board formed on the socket assembly, the socket assembly providing for communication between the mother board and the daughter board.

12. The system of claim 10 which includes:
    means to control independently the drive electronics for each of the DUT's.

13. The system of claim 12 which includes:
    means to control independently the temperature applied to each of the DUT's.

14. The system of claim 13 wherein the means to control the temperatures applied to the DUT's comprises a thermal control board which communicates with each of the conductive modules and the means to control the temperature of the DUT.

15. The system of claim 14 wherein the first and second temperature profiles are distinct.

* * * * *